(12) United States Patent
Paehrisch et al.

(10) Patent No.: US 12,740,028 B2
(45) Date of Patent: Sep. 15, 2026

(54) CONTACT ELEMENT FOR ELECTRONIC ARRANGEMENT

(71) Applicant: Robert Bosch GmbH, Stuttgart (DE)

(72) Inventors: Maik Paehrisch, Reutlingen (DE); Dennis Burger, Friolzheim (DE); Pascal Barth, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 244 days.

(21) Appl. No.: 18/691,291

(22) PCT Filed: Aug. 2, 2022

(86) PCT No.: PCT/EP2022/071651
§ 371 (c)(1),
(2) Date: Mar. 12, 2024

(87) PCT Pub. No.: WO2023/041241
PCT Pub. Date: Mar. 23, 2023

(65) Prior Publication Data

US 2024/0381594 A1 Nov. 14, 2024

(30) Foreign Application Priority Data

Sep. 14, 2021 (DE) ..................... 10 2021 210 153.4

(51) Int. Cl.
*H05K 7/20* (2006.01)
*H05K 9/00* (2006.01)
*H10W 40/47* (2026.01)

(52) U.S. Cl.
CPC ....... *H05K 7/20927* (2013.01); *H05K 9/0015* (2013.01); *H10W 40/47* (2026.01)

(58) Field of Classification Search
CPC ........... H05K 7/20254; H05K 7/20927; H05K 9/0015; H10W 40/47
See application file for complete search history.

(56) References Cited

U.S. PATENT DOCUMENTS

2017/0066344 A1 3/2017 Ishikawa

FOREIGN PATENT DOCUMENTS

JP 2015207611 A * 11/2015
JP 6296027 B2 * 3/2018 ................ B60L 1/02

(Continued)

OTHER PUBLICATIONS

Translation of Written Opinion of ISR for PCT/EP2022/071651 (Nov. 14, 2022).*

(Continued)

*Primary Examiner* — Zachary Pape
(74) *Attorney, Agent, or Firm* — Michael Best & Friedrich LLP

(57) ABSTRACT

The invention relates to an electronic arrangement (1), comprising: an electronic component (2), a cooler (3) for cooling the electronic component (2), a housing (4), and a contact element (5), wherein: the electronic component (2) and the cooler (3) are arranged within the housing (4); the cooler (3) has at least one coolant connection (31) which protrudes through a through-opening (41) in the housing (4); the contact element (5) interconnects the cooler (3) and the housing (4) in an electrically conductive manner, and the contact element (5) is designed and arranged concentrically with the through-opening (41).

19 Claims, 4 Drawing Sheets

(56) References Cited

FOREIGN PATENT DOCUMENTS

| | | | | |
|---|---|---|---|---|
| JP | 2020182363 | A | 11/2020 | |
| JP | 6859918 | B2 * | 4/2021 | ............. H02B 1/565 |
| WO | 2020217983 | A1 | 10/2020 | |

OTHER PUBLICATIONS

Reasons for Refusal for JP2024-516416 (Apr. 23, 2025).*
Reasons for Refusal for JP2024-516416 (Aug. 28, 2025).*
Translation of International Search Report for Application No. PCT/EP2022/071651 dated Nov. 14, 2022 (2 pages).

* cited by examiner 42
44
43
45
41
31
A
5
50
35
36
2
3b
3a
30
3
1
4

1
2
3
3a
3b
4
5
7
30
31
35
36
41
42
43
44
45
50
A 42
44
43
45
41
31
A
53
5
50
5
35
53
36
2
2
3b
3a
A
3
30
35
5
5
53
A
41
31
50
1
4
44

CONTACT ELEMENT FOR ELECTRONIC ARRANGEMENT

CROSS REFERENCE TO RELATED APPLICATION

This application is a national phase application of International Patent Application No. PCT/EP2022/071651, filed on Aug. 2, 2022, which claims priority to German Patent Application No. 102021210153.4, filed on Sep. 14, 2021, the entire contents of each are incorporated by reference herein.

BACKGROUND

The present invention relates to an electronic arrangement.

Electronic arrangements comprising power electronic components, e.g. for inverters, are known. In order to contain electromagnetic radiation sources and protect components of such electronic arrangements from electromagnetic radiation, they are, e.g., filtered or shielded. This is performed in conductors, e.g. by means of a shielding cable. In addition, capacitors can be used in electronic circuitry. The use of coolers to cool electronic components is also known in high-performance electronic arrangements. For example, coolers are used, through which a cooling medium flows. Such coolers are often made of metal. Particularly during switching operations of the electronic components mounted on the cooler, different electrical potentials may arise between the cooler and, for example, a housing.

SUMMARY

The electronic arrangement according to the invention is characterized in that it can be provided with an optimal electromagnetic compatibility while at the same time providing optimum cooling. In particular, interference voltages and/or capacitive couplings can thereby be particularly reliably prevented in the case of an electronic arrangement equipped with a cooler. According to the present invention, this is achieved by an electronic arrangement comprising an electronic component, a cooler configured for cooling the electronic component, a housing, and a contact element. The cooler is preferably designed as a liquid cooler, and particular a cooling liquid flows through it in order to thereby be able to dissipate heat particularly efficiently from the electronic component. The electronic component and the cooler are in this case arranged within the housing. For example, the housing can be made of metal in order to shield the electronic component from external electromagnetic radiation. The cooler comprises at least one coolant connection that protrudes through a through-opening in the housing. For example, the coolant connection can be designed to be integral with the cooler, or it can alternatively be designed as a separate component that is connected to the cooler. The coolant connection can, e.g., be used to supply a cooling chamber within the cooler, through which the cooling liquid can flow, with cooling liquid. The coolant connection thereby provides a means of supplying and/or discharging the cooling liquid from or to the outside of the housing. The contact element interconnects the cooler and the housing in an electrically conductive manner. The contact element is in this case designed and arranged to be concentric with the through-opening.

Preferably, the cooler is plate-shaped, e.g. comprising two plates which define a coolant chamber between them, through which cooling liquid can flow. The coolant connection is preferably arranged perpendicular to the plates. At least one partial area of the housing comprising the through-opening is preferably arranged substantially parallel to the cooler.

In other words, the electronic arrangement comprises a contact element that is arranged particularly close to and surrounding the coolant connection. As a result, a particularly direct and reliable equalization of electrical potentials of the cooler and housing can occur in the area of the coolant connection. As a result, an electrical potential of the cooler, in particular the coolant connection, can be prevented from changing or being displaced relative to the housing, thereby causing the coolant connection to emit an electromagnetic field similar to a Hertzian dipole arrangement, or an electrical near-field coupling to other components. Therefore, by means of the contact element, a particularly simple and cost-effective arrangement which reliably prevents different electrical potentials in the area of the coolant connections and the housing can be provided. Arranging the contact element to be concentric with the through-opening, and therefore close to the coolant connection, also enables the electronic arrangement to be designed for an optimum cooling effect for the electronic component. For example, a particularly large proportion of a surface of the cooler can therefore be used to dissipate heat from the electronic component.

A radial gap is preferably arranged between the coolant connection and the housing. The gap in this case enables, e.g., a certain relative mobility between the coolant connection and the housing. For example, different thermal expansions can as a result be compensated for and, e.g., a simple installation of the cooler enabled.

Particularly preferably, the coolant connection extends along a longitudinal axis, in particular in a tubular manner. The contact element thereby forms a mechanical contact as well as an electrically conductive contact of the cooler and housing along a direction parallel to the longitudinal axis. As a result, given that a good electrical contact between the housing and the cooler is ensured as close as possible to the coolant connection, an advantageous mechanical connection between the cooler and the housing can, e.g., be ensured such that different thermal expansions or relative displacements of the cooler and the housing are possible and are limited by the contact element little or not at all.

The contact element preferably comprises at least one contact area protruding parallel to the longitudinal axis. A particularly defined electrical contact between the housing and the cooler can as a result be created.

Further preferably, the contact element comprises a plurality of contact areas distributed around the circumference of the through-opening. On the one hand, an equalization of electrical potentials particularly evenly around the entire circumference of the coolant connection can be achieved thereby. Furthermore, only individual contact areas are arranged in a distributed manner, which simultaneously enables an advantageous mechanical connection between the cooler and the housing. By way of example, an effective seal in the area of the coolant connection can be provided as a result.

Particularly preferably, the contact areas are designed as cutting elements, or spherical areas, or pyramid peaks. Said "cutting elements" are, e.g., considered to be tapered elements which establish a substantially linear contact, in particular in a contact plane. The spherical areas can, e.g., be designed in the form of hemispheres protruding from a plane. The pyramid peaks can, e.g., be designed in the form of pyramidal or conical elements protruding from one plane.

The contact area is preferably designed in the form of an annular cutting edge. The expression "annular cutting edge" is considered to be a protruding element that is ring-shaped from one surface and features a tapered, in particular conical, cross-section. An annular cutting edge in this case offers a particularly simple and cost-effective geometry, which creates a linear contact designed as a circular ring around the coolant connection.

Further preferably, the cooler and the housing are fixedly interconnected, preferably screwed or clamped together, along a direction parallel to the longitudinal axis. The protruding contact area is in this case designed such that it presses into the opposite component in the direction of the longitudinal axis when the cooler and housing are connected for the first time, in particular when they are screwed together. In other words, the protruding contact area causes plastic deformation of the component against which the contact area is pressed during connection. It is particularly advantageous if the protruding contact area is formed on the housing and digs into the cooler when the housing and cooler are connected. Alternatively, the protruding contact area can also be formed on the cooler and dig into the housing when the housing and cooler are connected. It can thereby be particularly reliably ensured that a good electrically conductive contact is made after connection. In addition, a larger contact surface can be produced by, e.g., digging in with respect to to a point-shaped or linear annular contact.

The contact element preferably comprises a contact surface in order to form a flat contact between the cooler and the housing. As a result, a particularly large contact area for the electrical contact can be available. For example, the contact surface can be designed as a circular ring, i.e., an annular surface between two concentric circles, which is arranged concentrically with the through-opening.

The contact element is preferably designed as a component that is integral with the housing or with the cooler. As a result, a particularly simple and cost-effective design of the electronic arrangement is enabled. Particularly advantageous is a contact element that is designed to be integral with the housing, in which case the housing is preferably a cast component. Preferably, the contact element can in this case be produced for a particularly precise geometry by a subsequent machining of the housing.

Further preferably, the contact element is designed as a component that is separate from the housing and from the cooler. For example, the contact element can in this case be designed as a substantially disc-shaped component, in which case it can be simply and precisely attached to the cooler or to the housing.

Particularly preferably, if the contact element is designed as a component that is separate from the housing and the cooler, then it is connected to the housing or the cooler by means of an interlocking connection and/or by means of a bonded connection. For example, the contact element can be attached in an interlocking manner by means of a clip mechanism. Furthermore, a welded connection or an adhesive connection can, e.g., be provided as a bonded connection.

The cooler preferably comprises at least two coolant connections. The electronic arrangement in this case comprises one contact element for each coolant connection. In other words, a contact element is provided in close proximity to each of the coolant connections to obtain an optimal electrical application at all of the coolant connections to avoid different electrical potentials between the coolant connections and the housing.

Particularly preferably, the electronic arrangement further comprises a seal, which is arranged in a sealing manner between the cooler and the housing. Preferably, the seal is radially arranged within the contact element. In other words, the seal is preferably arranged to surround the coolant connection in order to prevent fluid from entering the housing between the housing and cooler in the area of the coolant connection.

The electronic component is preferably a power electronics unit, preferably an inverter. For example, the inverter can be provided for use in a motor vehicle.

BRIEF DESCRIPTION OF THE DRAWINGS

The invention is described in the following with reference to exemplary embodiments in conjunction with the drawings. In the drawings, functionally identical components are identified with respectively identical reference characters. Shown are.

DETAILED DESCRIPTION

Figure 1:
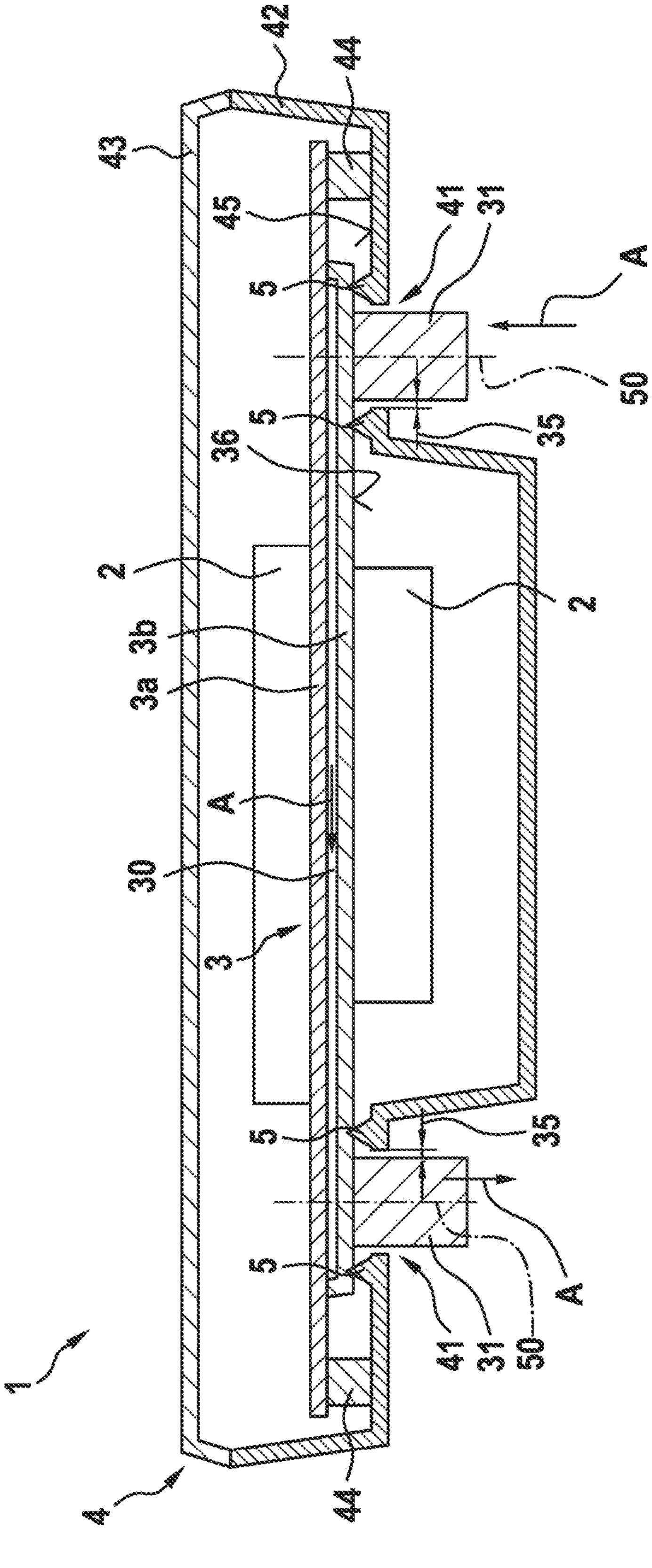
FIG. 1 a simplified schematic sectional view of an electronic arrangement according to a first exemplary embodiment of the invention, FIG. 2 a perspective detail view of the electronic arrangement in FIG. 1, FIG. 3 a simplified schematic sectional view of an electronic arrangement according to a second exemplary embodiment of the invention, and FIG. 4 a simplified schematic sectional view of an electronic arrangement according to a third exemplary embodiment of the invention.

FIG. 1 shows a simplified schematic sectional view of an electronic arrangement according 1 to a first exemplary embodiment of the invention. The electronic arrangement 1 comprises an electronic component 2, which comprises power electronics. In particular, the electronic arrangement 1 is an inverter of a motor vehicle. For example, the inverter can be provided for supplying electrical energy to an electric motor of the motor vehicle, wherein a supply of energy to the inverter can be performed by means of an electrical energy storage means of the motor vehicle.

The electronic arrangement further comprises a cooler 3 for cooling the electronic component 2. As can be seen in FIG. 1, partial areas of the electronic component 2 are in this case arranged on both sides of the cooler 3. As a result, a particularly efficient heat dissipation from the electronic component 2 can take place.

The cooler 3 is plate-shaped, with two cooling plates 3*a*, 3*b* connected to each other and arranged in parallel, between which there is a cooling channel 30. During operation of the electronic arrangement 1, a cooling medium, e.g. water, or another cooling liquid, flows through the cooling channel 30. For example, flow through the cooler 3 can in this case take place in the direction indicated by the arrows A.

The electronic component 2 and the cooler 3 are arranged within a housing 4. The housing 4 is used to protect against environmental factors, as well as preferably also against electromagnetic radiation. The housing 4 is in this case designed in two parts, with a housing bottom 42 and a housing cover 43.

The cooler 3 is screwed to the housing 4 on the shoulders 44 of the housing 4 in order to provide a mechanical connection and positioning of the cooler 3 and electronic component 2 in the housing 4.

In order to enable the coolant to flow through the cooler 3, the cooler 3 comprises two coolant connections 31, each of which is fluidically connected to the cooling channel 30. The coolant connections 31 are each designed as tubular connecting pieces, each extending along a longitudinal axis 50. The longitudinal axis 50 is in this case perpendicular to the cooling plates 3*a*, 3*b*.

The coolant connections 31 in this case each protrude through a through-opening 41 of the housing 4 such that the coolant connections 31 can be connected outside the housing 4, e.g. using lines (not shown). The through-openings 41 are in this case each designed such that a radial gap 35 exists between an inner circumference of the through-opening 41 and the respective coolant connection 31. As a result, the coolant connections 31 and housing 4 can move at least slightly against each other, e.g. due to different thermal expansions of the housing 4 and the cooler 3.

The electronic arrangement 1 further comprises one contact element 5 for each coolant connector 31.

Figure 2:
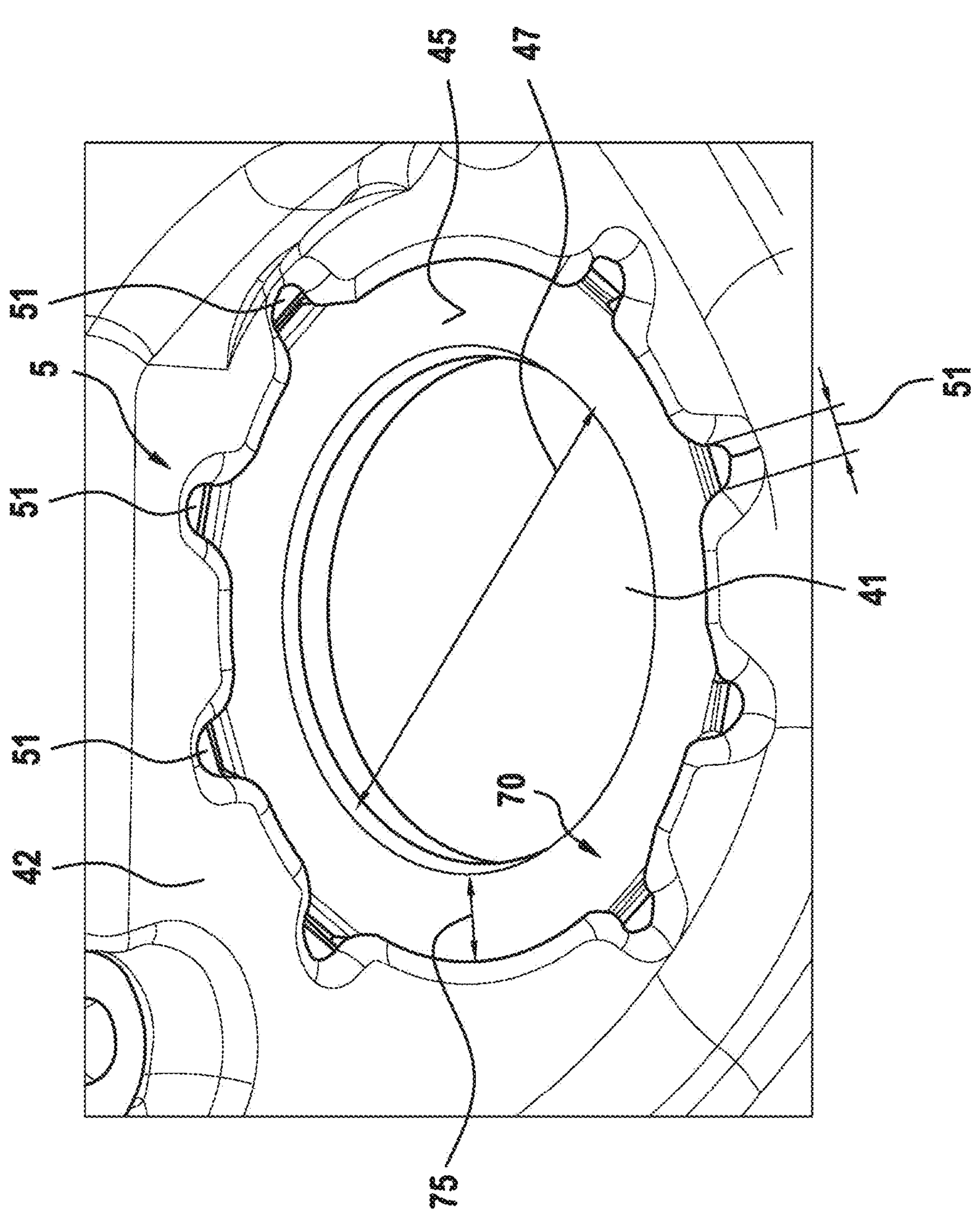

A single contact element 5 is shown in a perspective view in FIG. 2. The contact element 5 in this case comprises a plurality of protruding contact areas 51 arranged on a circular ring concentrically with the through-opening 41, which protrude from a base surface 45 of the housing bottom 42 facing the cooler 3 along a direction parallel to the longitudinal axis 50. Each contact area 51 is in this case designed in the form of a cutting element, which has a predetermined length 51*a* in a plane parallel to the base surface 45 and which is tapered in cross section (see FIG. 1).

All of the contact areas 51 are in this case arranged at a predefined radial distance 75 from an inner circumference of the through-opening 41. The radial distance 75 is preferably at most 50%, preferably at most 30%, particularly at least 10%, of an inner diameter 47 of the through-opening 41.

The cooler 3 and the housing 4 are in this case screwed together such that the contact areas 51 dig into the underside 36 of the cooler 3. As a result, the contact element 5 forms a mechanical and an electrical contact between the housing 4 and cooler 3. Therefore, potential differences in an electrical potential between the cooler 3 and housing 4 caused by the electronic component 2 can be equalized via the contact elements 5. Given that the contact elements 5 are arranged to be concentric with the through-opening 41, and therefore particularly close to the coolant connections 31, potential differences at or in the area of the coolant connections 31 can also be compensated for particularly reliably and without significant carryovers. For example, the coolant connections 31 can as a result be prevented from having different potentials during fast switching operations of the electronic component 2 compared to areas of the cooler 3 close to the shoulders 44 if they are, e.g., also in electrically contact with the housing 4.

As a result of the contact areas 51 being designed in the form of cutting elements, contact with the cooler 3 is substantially linear, and yet only distributed selectively around the circumference of the through-opening 41. As a result, a good compromise is achieved between the greatest possible contact for equalizing electrical potentials and, on the other hand, sufficient flexibility of the mechanical contact between the cooler 3 and housing 4 in order to be able to additionally provide sealing by means of an additional seal between the cooler 3 and the housing 4 in the area of the coolant connections 31.

Figure 3:
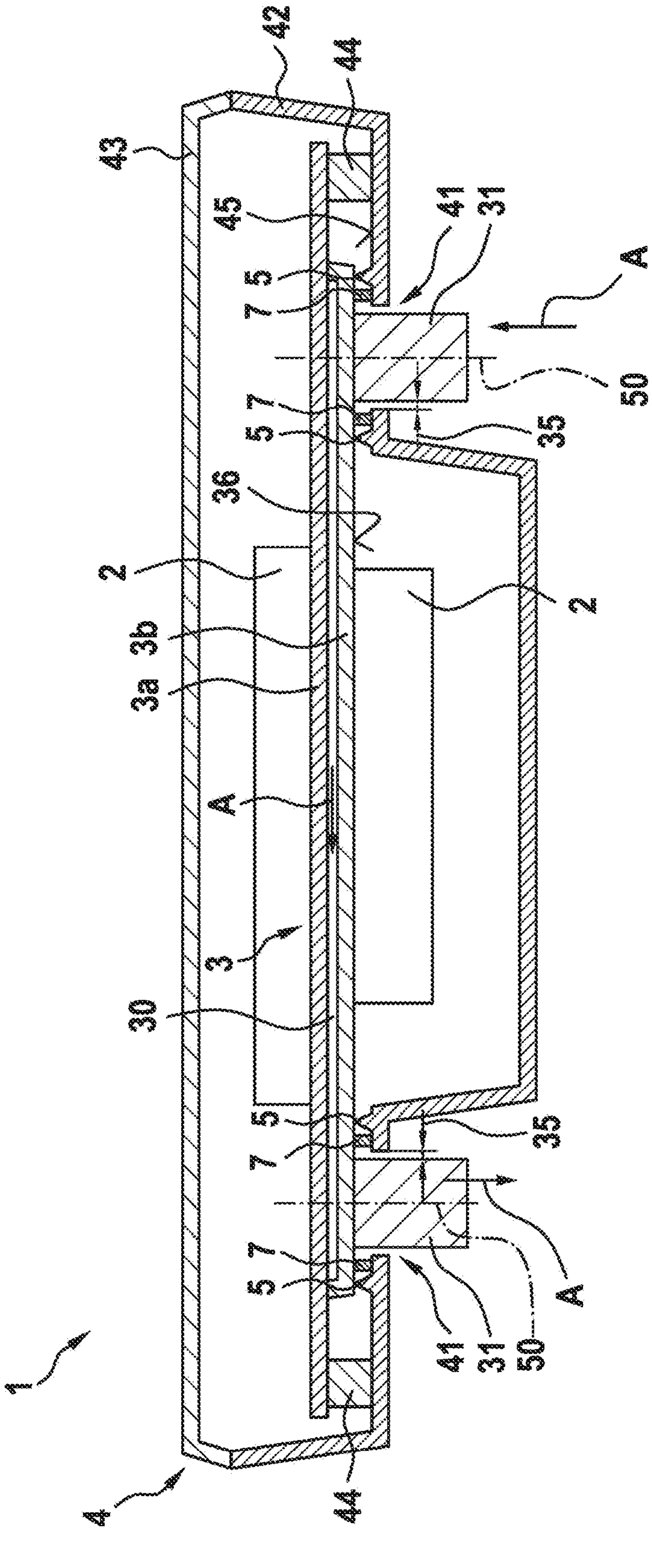

Such sealing by means of an additional seal 7 is provided in the second exemplary embodiment shown in FIG. 3. The second exemplary embodiment thereby substantially corresponds to the first exemplary embodiment in FIGS. 1 and 2, with the difference of the additional seal 7. The seal 7 is made of an elastic material.

The seal 7 is in this case arranged in a sealing manner between the cooler 3 and the housing 4, the seal 7 being arranged radially within the contact element 5. Specifically, the seal 5 is located on a sealing surface 70, which is located radially within the contact areas 51 and is a part of the base surface 45 of the housing bottom 42 (see FIG. 2).

Figure 4:
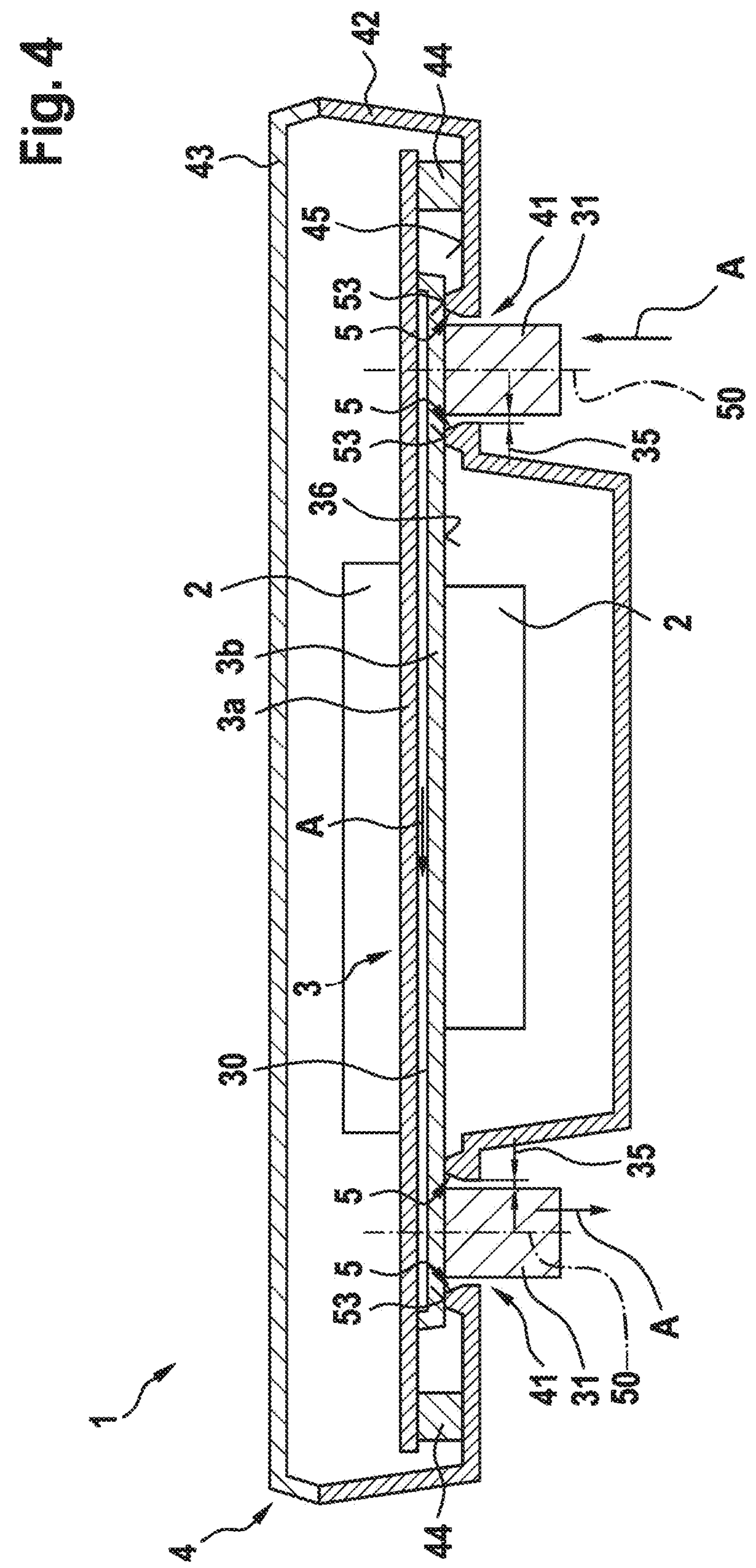

FIG. 4 shows a simplified schematic sectional view of an electronic arrangement 1 according to a third exemplary embodiment of the invention. The third exemplary embodiment substantially corresponds to the first exemplary embodiment in FIGS. 1 and 2, with the difference that the contact element 5 comprises a single contact surface 53 instead of a plurality of contact areas 51 distributed around the circumference, which produces a flat contact between the cooler 3 and housing 4. The contact surface 53 can be used to produce a particularly good electrical contact between the cooler 3 and housing 4 in order to equalize the electrical potentials in the area of the coolant connections 31 between cooler 3 and housing 4 particularly reliably. The contact surface 53 is in this case designed to be close to an inner circumference of the through-opening 41. The contact surface 53 is in this case formed by a top side of an area protruding from the base surface 45 of the housing bottom 42.

The invention claimed is:

1. An electronic arrangement comprising:

an electronic component (2);

a cooler (3) for cooling the electronic component (2);

a housing (4); and a contact element (5), wherein the electronic component (2) and the cooler (3) are arranged within the housing (4), wherein the cooler (3) has two coolant connections (31), each of the two coolant connections (31) protrudes through a through-opening (41) of the housing (4), wherein the contact element (5) interconnects the cooler (3) and the housing (4) in an electrically conductive manner, wherein the contact element (5) is configured and arranged concentrically with the through-opening (41), and wherein the electronic arrangement (1) comprises one contact element (5) for each of the two coolant connections (31).

2. The electronic arrangement according to claim 1, wherein a radial gap (35) is arranged between each of the two coolant connections (31) and the housing (4).

3. The electronic arrangement according to claim 1, wherein each of the two coolant connections (31) extends along a longitudinal axis (50) and wherein the respective contact element (5) forms a mechanical contact and an electrically conductive contact between the cooler (3) and the housing (4) in a direction parallel to the longitudinal axis (50).

4. The electronic arrangement according to claim 3, wherein the respective contact element (5) includes at least one contact area (51) protruding parallel to the longitudinal axis (50).

5. The electronic arrangement according to claim 4, wherein the respective contact element (5) includes a plurality of contact areas (51) distributed around a circumference of the through-opening (41).

6. The electronic arrangement according to claim 5, wherein the plurality of contact areas (51) are configured as cutting elements, or spherical areas, or pyramid peaks.

7. The electronic arrangement according to claim 4, wherein the at least one contact area (51) is configured as an annular cutting edge.

8. The electronic arrangement according to claim 4, wherein the cooler (3) and the housing (4) are connected in a fixed manner in a direction parallel to the longitudinal axis (50), and wherein the at least one contact area (51) is configured to press into an opposing component in the direction of the longitudinal axis (50) when the cooler (3) and housing (4) are screwed together for the first time.

9. The electronic arrangement according to claim 3, wherein each of the two coolant connections (31) extends along the longitudinal axis (50) in a tubular manner.

10. The electronic arrangement according to claim 1, wherein each contact element (5) includes a contact surface (53) for forming a flat contact between the cooler (3) and housing (4).

11. The electronic arrangement according to claim 1, wherein each contact element (5) is configured as a component that is integral with the housing (4) or with the cooler (3).

12. The electronic arrangement according to claim 1, wherein each contact element (5) is configured as a component that is separate from the housing (4) and the cooler (3).

13. The electronic arrangement according to claim 12, wherein each contact element (5) is connected to the housing (4) or to the cooler (3) by an interlocking connection and/or by a bonded connection.

14. The electronic arrangement according to claim 1, further comprising a seal (7) arranged in a sealing manner between the cooler (3) and housing (4).

15. The electronic arrangement according to claim 14, wherein the seal (7) is arranged radially within the contact element (5).

16. The electronic arrangement according to claim 1, wherein the electronic component (2) includes power electronics.

17. The electronic arrangement according to claim 16, wherein the power electronics include an inverter.

18. An electronic arrangement comprising:

an electronic component (2);

a cooler (3) for cooling the electronic component (2);

a housing (4); and a contact element (5), wherein the electronic component (2) and the cooler (3) are arranged within the housing (4), wherein the cooler (3) has at least one coolant connection (31) which protrudes through a through-opening (41) of the housing (4), wherein the contact element (5) interconnects the cooler (3) and the housing (4) in an electrically conductive manner, wherein the contact element (5) is configured and arranged concentrically with the through-opening (41), wherein the at least one coolant connection (31) extends along a longitudinal axis (50) and wherein the contact element (5) forms a mechanical contact and an electrically conductive contact between the cooler (3) and the housing (4) in a direction parallel to the longitudinal axis (50), wherein the contact element (5) includes at least one contact area (51) protruding parallel to the longitudinal axis (50), and wherein the cooler (3) and the housing (4) are connected in a fixed manner in a direction parallel to the longitudinal axis (50), and wherein the at least one contact area (51) is configured to press into an opposing component in the direction of the longitudinal axis (50) when the cooler (3) and housing (4) are screwed together for the first time.

19. An electronic arrangement comprising:

an electronic component (2);

a cooler (3) for cooling the electronic component (2);

a housing (4); and a contact element (5), wherein the electronic component (2) and the cooler (3) are arranged within the housing (4), wherein the cooler (3) has at least one coolant connection (31) which protrudes through a through-opening (41) of the housing (4), wherein the contact element (5) interconnects the cooler (3) and the housing (4) in an electrically conductive manner, wherein the contact element (5) is configured and arranged concentrically with the through-opening (41), and wherein the contact element (5) includes a contact surface (53) for forming a flat contact between the cooler (3) and housing (4).

* * * * *